United States Patent

Antoniadis et al.

[11] Patent Number: 5,948,552
[45] Date of Patent: Sep. 7, 1999

[54] HEAT-RESISTANT ORGANIC ELECTROLUMINESCENT DEVICE

[75] Inventors: Homer Antoniadis, Mountain View; Daniel B. Roitman, Menlo Park, both of Calif.; William R. Shiang, Sanford, Mich.; Edmund P. Woo; Weishi Wu, both of Midland, Mich.

[73] Assignees: Hewlett-Packard Company, Palo Alto, Calif.; The Dow Chemical Company, Midland, Mich.

[21] Appl. No.: 08/704,476

[22] Filed: Aug. 27, 1996

[51] Int. Cl.$^6$ .............. H05B 33/00; B05D 5/12
[52] U.S. Cl. .......... 428/690; 428/457; 428/704; 428/917; 313/504; 313/506; 427/66; 427/384; 427/402
[58] Field of Search .................. 428/690, 917, 428/704, 457; 313/504, 506; 427/66, 384, 402

[56] References Cited

U.S. PATENT DOCUMENTS

| | | | |
|---|---|---|---|
| 4,356,429 | 10/1982 | Tang .......................................... | 313/503 |
| 4,539,507 | 9/1985 | VanSlyke et al. ....................... | 313/504 |
| 4,885,211 | 12/1989 | Tang et al. ............................... | 428/457 |
| 5,047,687 | 9/1991 | VanSlyke ................................. | 313/503 |
| 5,059,862 | 10/1991 | VanSlyke et al. ....................... | 313/503 |
| 5,061,561 | 10/1991 | Katayama ................................ | 428/364 |

(List continued on next page.)

FOREIGN PATENT DOCUMENTS

| | | |
|---|---|---|
| 0 372 979 | 6/1990 | European Pat. Off. . |
| 0 443 861 A2 | 8/1991 | European Pat. Off. . |
| 0 517 542 A1 | 2/1992 | European Pat. Off. . |
| 0 637 899 A1 | 2/1995 | European Pat. Off. . |

(List continued on next page.)

OTHER PUBLICATIONS

Adachi, Chihaya et al., "Confinement of Charge Carriers and Molecular Excitons within 5–nm–thick Emitter Layer in Organic Electroluminescent Devices with a Double Heterostructure", Appl. Phys. Lett., vol. 57, No. 6 (Aug. 6, 1990), pp. 531–533.

(List continued on next page.)

Primary Examiner—Marie Yamnitzky
Attorney, Agent, or Firm—Ian Hardcastle

[57] ABSTRACT

An organic electroluminescent device that comprises a substrate, a first conductive layer on the substrate, an electron-transporting and light-emitting layer, a second conductive layer adjacent the electron-transporting and light-emitting layer and remote from the first conductive layer, and a hole-conducting layer sandwiched between the first conductive layer and the electron-transporting and light-emitting layer. The hole-conducting layer comprises a poly (arylamine) including at least one compound of formula (I):

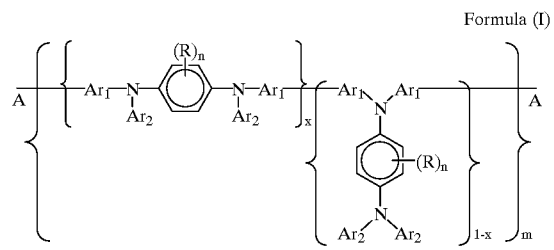

Formula (I)

In this:
R is independently in each occurrence a $C_{1-24}$ hydrocarbyl, hydrocarboxyl, hydrothiocarboxy, hydroarylcarboxy, or hydrothioarylcarboxy; $Ar_1$ and $Ar_2$ are independently in each occurrence a $C_{6-18}$ aryl moiety optionally substituted with one or more $C_{1-24}$ hydrocarbyl, hydrocarboxyl, hydrothiocarboxy, hydroarycarboxy, or hydrothioarylcarboxy; A is independently in each occurrence hydrogen or a halogen; x is independently in each occurrence a positive number between 0 and 1; n is a whole number from 0 to 4; and m is a number from about 5 to about 1000.

24 Claims, 2 Drawing Sheets

U.S. PATENT DOCUMENTS

| | | | |
|---|---|---|---|
| 5,061,569 | 10/1991 | Van Slyke et al. | 428/457 |
| 5,256,945 | 10/1993 | Imai et al. | 313/504 |
| 5,352,554 | 10/1994 | Mishima et al. | 430/59 |
| 5,352,834 | 10/1994 | Morishita et al. | 564/309 |
| 5,554,450 | 9/1996 | Shi et al. | 428/690 |
| 5,728,801 | 3/1998 | Wu et al. | 528/422 |

FOREIGN PATENT DOCUMENTS

| | | |
|---|---|---|
| 0 699654 | 3/1996 | European Pat. Off. . |
| 0 710 893 A1 | 5/1996 | European Pat. Off. . |
| 0 721 935 A1 | 7/1996 | European Pat. Off. . |
| 5-239455 | 9/1993 | Japan . |
| 5-311163 | 11/1993 | Japan . |
| 95/09147 | 4/1995 | WIPO . |
| 97/09394 | 3/1997 | WIPO . |

OTHER PUBLICATIONS

Baker, T. Nelson, III et al., "Electrophilic Substitution Reactions of Triphenylamine", Journal of Organic Chemistry, vol. 30, pp. 3714–3718 (Nov. 1965).

Chemical Abstract, 93–365193/46 (1993).

Derwent 97–359265/199733 (JP 915137 A).

Ishikawa, Masazumi et al., "Synthesis and Properties of Electrically Conducting Polytriphenylamines", Synthetic Metals, vol. 40, pp. 231–238 (1991).

Ishikawa, Wataru et al., "Novel Amorphous Molecular Materials: The Starburst Molecule 1,3,5–Tris [N–(4–diphenylaminophenyl)–phenylamino]benzene", Advanced Materials, vol. 5, No. 7/8, pp. 559–561 (1993).

Kuwabara, Yoshiyuki et al., "Thermally Stable Multilayered Organic Electroluminescent Devices Using Novel Starburst Molecules, 4,4',4"–Tri(N–carbozolyl)triphenylamine (TCTA) and 4,4', 4"–Tris(3–methylphenylphenylamino)triphenylamine (m–MTDATA), as Hole–Transport Materials", Advanced Materials, vol. 6, No. 9, pp. 677–679 (1994).

Pai, D.M. et al., Journal Phys. Chem., vol. 88, No. 20, pp. 4714–4717 (1984).

Tang, C.W. et al., Appl. Phys. Lett., vol. 51, No. 12, pp. 913–915 (Sep. 1987).

Adachi, Chihaya et al., Appl. Phys. Lett., vol. 56, No. 9, pp. 799–801 (Feb. 1990).

Kido, Junji et al., Appl. Phys. Lett., vol. 61, No. 7, pp. 761–763 (Aug. 1992).

Colon, et al., Journal of Polymer Science, Part A, Polymer Chemistry, vol. 28, pp. 367–383 (1990).

Gautier, Sylvie, et al., Synthesis, pp. 383–385 (Apr. 1987).

Guram, Anil S. et al., Angewandte Chemie Int'l Ed. In English, vol. 34, No. 12, pp. 1348–1350, 1995.

Iyoda et al., Bulletin of the Chemical Society of Japan, vol. 63, No. 1, pp. 80–87 (1990).

Miyaura, et al., Synthetic Communications, vol. 11, pp. 513–519 (1981).

Wallow et al., American Chemical Society Polymer Preprint, vol. 34(1), pp. 1009–1010 (1993).

Yamamoto, Takakazu, Progress in Polymer Science, vol. 17, pp. 1153–1205 (1992).

Tokita S. et al., "High–Temperature Operation of an Electroluminescent Device Fabricated using a Novel Triphenylamine Derivative", Applied Physics Letters, vol. 69, No. 7, Aug. 12, 1996, pp. 878–880.

Shirota Y. et al., "Multilayered Organic Electroluminescent Device using a Novel Starburst Molecule . . . ", Applied Physics Letters, vol. 65, No. 7, Aug. 15, 1994, pp. 807–809.

*Research Disclosure,* Jul. 1992, No. 339, pp. 571–573, "Electroluminescent Device and Substances Suited for Use Therein", disclosed by D. Terrell.

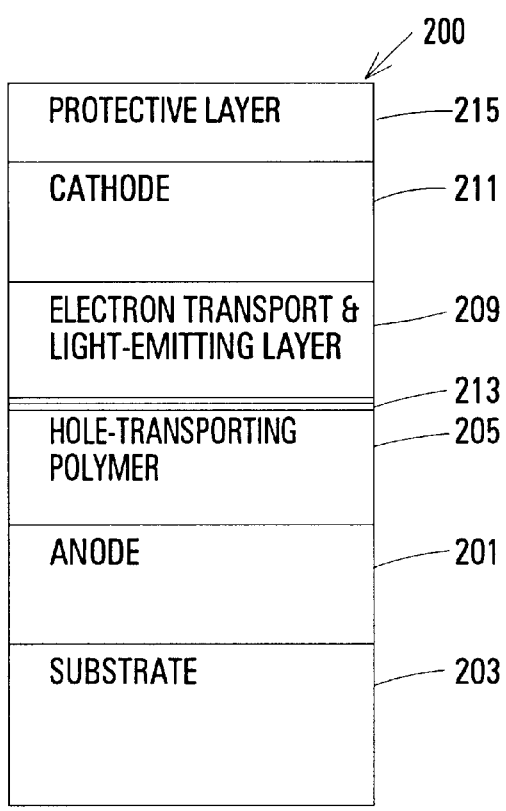
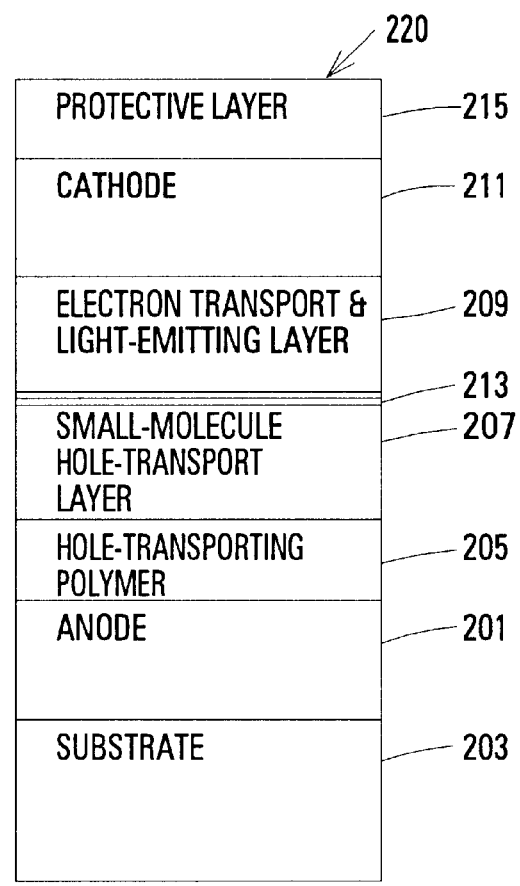
FIGURE 2
FIGURE 3

HEAT-RESISTANT ORGANIC ELECTROLUMINESCENT DEVICE

FIELD OF THE INVENTION

The present invention relates generally to electroluminescent devices and more particularly to an organic electroluminescent device having improved anodic structures adjoining organic active layers.

BACKGROUND OF THE INVENTION

There has been an increasing need for versatile visual displays for electronic products of many kinds. Light-emitting diodes ("LEDs") and liquid-crystal displays ("LCDs") have found many useful applications but have not been adequate in all cases. A visual display that is of relatively recent origin and that has shown much promise is the organic electroluminescent device. An electroluminescent device basically consists of an electroluminescent substance placed between a pair of electrodes. When an electric potential is applied across the electrodes, the electroluminescent substance emits visible light. Typically one of the electrodes is translucent, permitting the light to shine through.

FIG. 1 illustrates a typical electroluminescent device of the kind known in the art. A glass substrate 101 is coated with a translucent anode 103. A translucent hole transport layer 105 covers part of the anode and an electron transport layer 107 covers the hole transport layer, forming an interface 109 between the two layers. A cathode 111 covers the electron transport layer. In some devices the hole transport layer consists of two sublayers having slightly different composition, one sublayer forming a lower region 113 adjacent the anode and the other sublayer forming an upper region 115 adjacent the electron transport layer. The thicknesses of the anode, hole transport layer, electron transport layer and cathode are each of the order of 10–500 nanometers (100–5000 Ångstroms).

In operation, electric power from a voltage source 117 is applied to the anode and the cathode, biasing the anode positive with respect to the cathode. This causes regions of positive charge ("holes") to migrate through the hole transport layer from the anode toward the electron transport layer and electrons to migrate from the cathode through the electron transport layer toward the hole transport layer. The holes and electrons combine at the interface 115 between the two layers, emitting visible light. The light propagates out of the device through the hole transport layer, the anode and the substrate as indicated by an arrow 119.

It has been found that certain organic materials are particularly well suited for fabricating the hole and electron transport layers. An electroluminescent device fabricated of such materials is called an organic electroluminescent device. The anode of a typical organic electroluminescent device is made of indium tin oxide ("ITO"). Then the hole transport layer is formed by vapor deposition of N,N'-diphenyl-N-N'-bis(3-methylphenyl)-1,1'-biphenyl-4,4'-diamine ("TPD"). Next, the electron transport layer is formed, also by vapor deposition, of aluminum tris-8-hydroxyquinoline ($Alq_3$). Finally the cathode is formed by thermal evaporation of magnesium (Mg) and silver (Ag). Many different compounds and variations in structure have been used for the different layers and regions in organic electroluminescent devices. Examples of such devices and the specific compounds of which they are made are found in such references as U.S. Pat. No. 4,356,429 (Tang) issued Oct. 26, 1982; U.S. Pat. No. 4,539,507 (VanSlyke et al.) issued Sep. 3, 1985; U.S. Pat. No. 4,885,211 (Tang et al.) issued Dec. 5, 1989; U.S. Pat. No. 5,047,687 (VanSlyke) issued Sep. 10, 1991; and U.S. Pat. No. 5,059,862 (VanSlyke et al.) issued Oct. 22, 1991, U.S. Pat. 5,061,569 (VanSlyke et al.) issued Oct. 29, 1991, all of which are incorporated herein by this reference. See also Tang et al., *Electroluminescence of Doped Organic Thin Films*, JOURNAL OF APPLIED PHYSICS no. 65(9), May 1, 1989, pages 3610–3616.

Use of a conducting polymer as the anode in a flexible LED based on poly[2-methoxy-5-(2'-ethyl-hexyloxy)-1,4-phenylene vinylene] ("MEH-PPV") has been reported. This type of LED is fabricated by spin-casting MEH-PPV onto the anode to form the electroluminescent layers. The use in such a LED of a conducting film of polyaniline ("PANI"), either in place of or in addition to an ITO anode, is disclosed by Yang et al., Enhanced Performance of Polymer Light-Emitting Diodes Using High-Surface Area Polyaniline Network Electrodes, JOURNAL OF APPLIED PHYSICS, Jan. 15, 1995, pages 694–698; Cao et al., Solution-Cast Films of Polyaniline: Optical-Quality Transparent Electrodes, APPLIED PHYSICS LETTERS 60 (22), Jun. 1, 1992, pages 2711–2713; and Yang et al., Polyaniline as a Transparent Electrode for Polymer Light-Emitting Diodes: Lower Operating Voltage and Higher Efficiency, APPLIED PHYSICS LETTERS 64 (10), Mar. 7, 1994, pages 1245–1247. The reported advantages to using PANI in such LEDs include mechanical strength, reduced drive voltage, increased efficiency and adaptability to a flexible substrate.

A recurring problem with organic electroluminescent devices is a very short service life when continuously driven. Typically such a device has a service life of less than 30 hours before all luminance disappears. There have been many attempts to overcome this problem and to provide an organic electroluminescent device with a better service life. For example, it is proposed by Adachi et al. in Molecular Design of Hole Transport Materials for Obtaining High Durability in Organic Electroluminescent Diodes, APPLIED PHYSICS LETTERS no. 66 (20), May 15, 1995, pages 2679–2681, to use certain aromatic amines for the hole transport layer. Many aromatic tertiary amines that have been used to fabricate hole transport layers are disclosed in such references as U.S. Pat. No. 4,885,211 (Tang et al.) at column 14 and U.S. Pat. No. 5,059,862 (VanSlyke et al.) at column 9. Adachi et al. report service lives ranging from a few hours for devices having hole transport layers made of some such amines to as much as 500 hours for others. Adachi et al. suggest that devices having hole transport layers fabricated of those amines which provided the smallest energy barrier between the anode and the hole transport layer had the longest service lives.

Another proposal for increasing the service lives of organic electroluminescent devices by using amines for the hole transport layer is set forth in U.S. Pat. No. 5,374,489 (Imai et al.) issued Dec. 20, 1994. Imai et al. propose using 4,4',4"-tri(N-phenothiazinyl)triphenylamine ("TPTTA" for short) or 4,4',4"-tri(N-phenoxazinyl)triphenylamine ("TPOTA") for the hole transport layer. Using TPTTA for the hole transport layer (Example 1) resulted in a half-life of 385 hours, and using TPOTA (Example 2) yielded a half-life of 370 hours. By comparison, using TPD for the hole transport layer resulted in a half-life of only 131 hours. Better results were achieved by using two different amines, one for each of the two regions of the hole transport layer. In Example 3, TPTTA was used for the upper region of the hole transport layer adjacent the luminescent layer and a second amine characterized by a "star burst" molecule, that is a molecule having a stellar structure such as 4,4',4"-tris [N-e-methylphenyl)-N-phenylamino]-triphenylamine ("MTDATA") was used for the lower region adjacent the anode. A half-life of 550 hours resulted. Example 4 was similar except that TPOTA was used for the upper region, resulting in a half-life of 530 hours.

In U.S. Pat. No. 5,306,572 (Ohashi et al.) issued Apr. 26, 1994, attention was concentrated on the interfaces between the various layers of the organic electroluminescent device. In one embodiment it was proposed to create an "interfacial" layer between the anode and the hole transport layer by treating one of the layers with a silane-coupling agent to reduce unevenness of the anode layer and improve adherence between the layers. The silane-coupling agent is a compound represented by the formula X-Si(OR)$_3$ where R is a hydrolyzable group and X is a functional group capable of reacting with the organic substance such as an amino, vinyl, epoxy or mercapto group or a halogen. Devices fabricated using various silane-coupling agents were claimed to have service lives of between 5,000 and 8,000 hours, compared to 10 hours for a device that omitted the silane-coupling agent. Service lives of up to 15,000 hours were claimed by forming a hydrogenated microcrystalline silicon film on the anode prior to using the silane-coupling agent. The repeatability of this work is uncertain, and the cost of implementing the technique in production may be higher than desired.

In U.S. patent application Ser. No. 08/508,020, (now U.S. Pat. No. 5,719,467) assigned to the one of the assignees of the present application, the inventors of the present application disclosed an organic electroluminescent device that uses a conducting form of a PANI film in its anodic structure to achieve greatly improved lifetimes. This organic electroluminescent device included a thin film of a conducting polymer such as polyaniline doped with camphor-sulfonic acid between the anode and the hole transport layer. In an alternative embodiment, the conducting polymer itself served as the anode. Service lifetimes of the order of 1000 hours were provided. However, in common with many other known organic electroluminescent devices, the light output and service life were substantially reduced by subjecting the electroluminescent device to temperatures in the range to which an electroluminescent device installed in an automobile dashboard, for example, could be subject when the car is parked in the sun.

From the foregoing it will be seen that there remains a need for an economical, reliable, durable, commercially-practical organic electroluminescent device whose service life and light output are not impaired by exposure to high temperatures.

SUMMARY OF THE INVENTION

The invention provides an organic electroluminescent device that comprises a substrate, an electron-transporting and light-emitting layer, and a hole-conducting layer sandwiched between the substrate and the electron-transporting and light-emitting layer. The hole-conducting layer comprises a poly(arylamine) including at least one compound of formula (I):

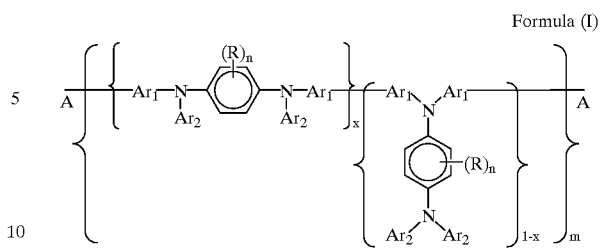

Formula (I)

In this:
R is independently in each occurrence a $C_{1-24}$ hydrocarbyl, hydrocarboxyl, hydrothiocarboxy, hydroarylcarboxy, or hydrothioarylcarboxy; $Ar_1$ and $Ar_2$ are independently in each occurrence a $C_{6-18}$ aryl moiety optionally substituted with one or more $C_{1-24}$ hydrocarbyl, hydroarylcarboxy, hydrothiocarboxy, hydroarycarboxy, or hydrothioarylcarboxy; A is independently in each occurrence hydrogen or a halogen; x is independently in each occurrence a positive number between 0 and 1; n is a whole number from 0 to 4; and m is a number from about 5 to about 1000.

The electroluminescent device may additionally comprise a substrate including a first conductive layer, and may also comprise an electron-transporting and light-emitting layer. The first conductive layer is translucent. The layer of the poly(arylamine) provides a hole-transporting layer and is sandwiched between the first conductive layer and the electron-transporting and light-emitting layer. The electroluminescent device may also comprise a second conductive layer adjacent the electron-transporting and light-emitting layer, and remote from the hole-transporting layer.

The electron transporting and light-emitting layer may be a metal chelated oxinoid compound represented by the structural formula (0):

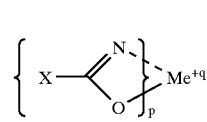

Formula (0)

in which Me represents a metal, q is an integer between 0 and 3 and X independently in each occurrence represents atoms completing a nucleus having at least two fused aromatic rings, at least one of which is an azole or azine ring. Preferably, the electron transporting and light-emitting layer is aluminum tris-8-hydroxyquinoline ("Alq$_3$"), which, optionally, may include a fluorescent dye.

The electroluminescent device may also include a layer of an aromatic tertiary amine interposed between the layer of the poly(arylamine) and the electron-transport and light-emitting layer. The aromatic tertiary amine may contain at least two tertiary amine molecules and including, attached to a tertiary amine nitrogen atom, an aromatic moiety containing an aromatic ring or at least two fused aromatic rings. The preferred aromatic tertiary amine is N,N'-diphenyl-N-N'-bis (3-methylphenyl)-1,1'-biphenyl-4,4'-diamine ("TPD").

The invention also provides a method of making an organic electroluminescent device. In the method, a substrate having a translucent conductive layer, a solution of a poly(arylamine) including at least one compound of formula (I) set forth above, an electron-transporting and light-emitting material, and a conductive material are provided. A device structure is formed on the translucent conductive layer by coating from the solution a layer of the poly (arylamine) onto the translucent conductive layer to form a hole-transporting layer, depositing a layer of the electron-transporting and light-emitting material on the layer of the poly(arylamine), and depositing a layer of the conductive material on the layer of the electron-transporting and light-emitting material.

An aromatic tertiary amine may additionally be provided. The aromatic tertiary amine may contain at least two tertiary amine molecules and including, attached to a tertiary amine nitrogen atom, an aromatic moiety containing an aromatic ring or at least two fused aromatic rings. The device structure may be formed by depositing a layer of the aromatic tertiary amine onto the layer of the poly(arylamine) to form a small-molecule hole transporting layer, and the layer of the electron-transporting and light-emitting material may be deposited on the layer of the aromatic tertiary amine. N,N'-diphenyl-N-N'-bis(3-methylphenyl)-1,1'-biphenyl-4,4'-diamine ("TPD") is preferably provided as the aromatic tertiary amine.

The device structure may be formed by additionally annealing the substrate and the layer of the poly(arylamine) prior to depositing the layer of the electron-transporting and light-emitting material.

A metal chelated oxinoid compound represented by the structural formula (0) may be provided as the electron-transporting and light-emitting material:

Formula (0)

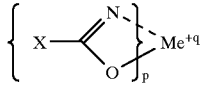

In this, Me represents a metal, q is an integer between 0 and 3 and X independently in each occurrence represents atoms completing a nucleus having at least two fused aromatic rings, at least one of which is an azole or azine ring. The metal chelated oxinoid compound preferably includes aluminum tris-8-hydroxyquinoline ("Alq$_3$").

Finally, depositing the layer of the electron-transporting and light-emitting material may include doping the electron-transporting and light-emitting material with the fluorescent dye.

BRIEF DESCRIPTION OF THE DRAWINGS

FIG. 2 shows a schematic representation of a first embodiment of an electroluminescent device according to the invention.

FIG. 3 shows a schematic representation of a second embodiment of an electroluminescent device according to the invention.

DETAILED DESCRIPTION OF THE INVENTION

Figure 1:
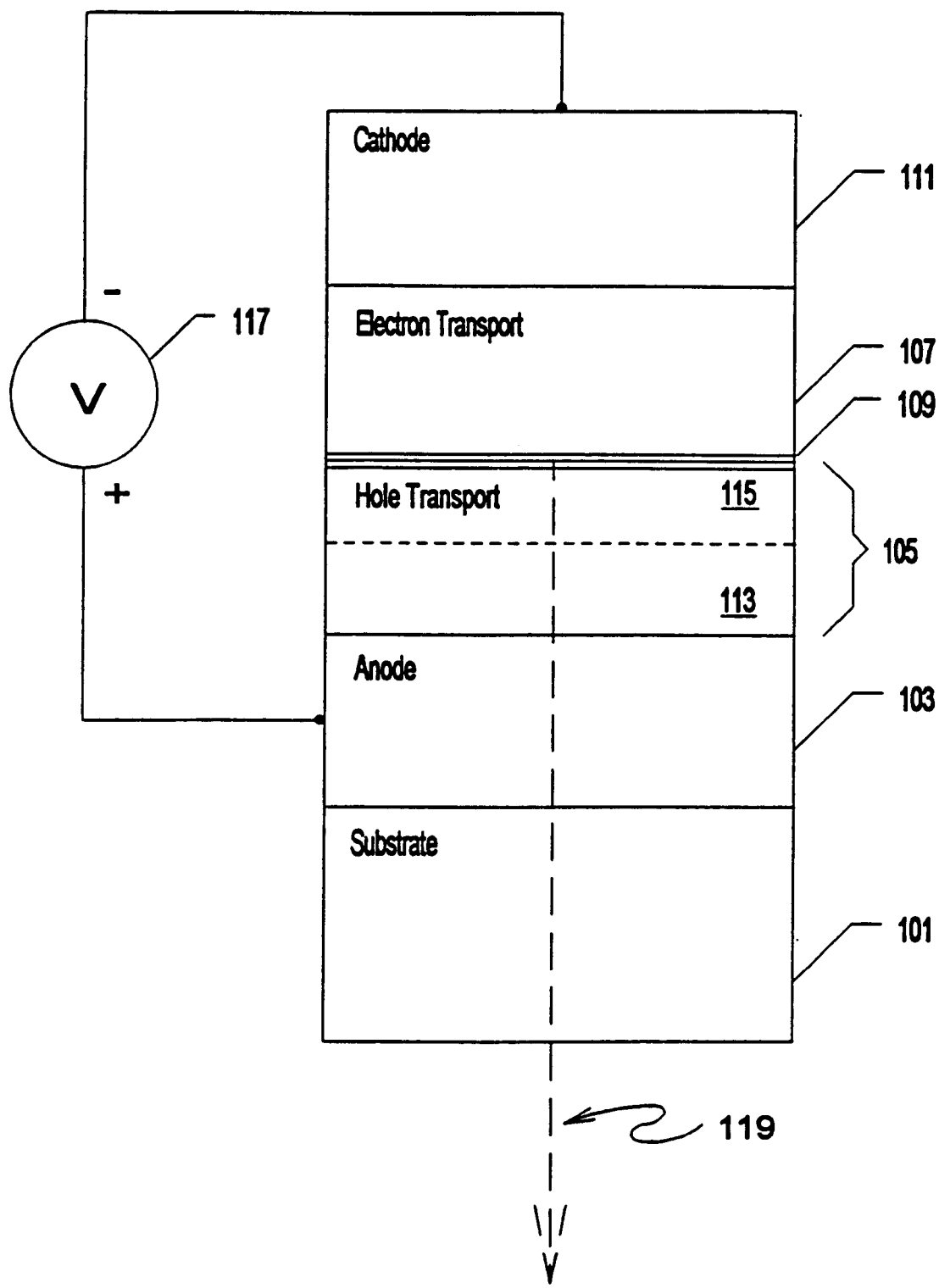
FIG. 1 shows a schematic depiction of a known electroluminescent device.

The present invention provides an organic electroluminescent device that includes, in a first embodiment, a hole transport layer composed of a hole-transporting polymer, and, in a second embodiment, a thin layer of a hole-transporting polymer interposed between the anode and a small-molecule hole transport layer. Other structural arrangements result in organic electroluminescent devices having lifetimes of only a few hours or other drawbacks. An organic electroluminescent device according to the invention is simple and economical to make and has an extended service life at elevated temperatures.

Referring now to FIG. 2, the organic electroluminescent device 200 according to the invention includes the translucent anode 201 on the substrate 203; the hole-transport layer 205, composed of a layer of a hole-transporting polymer, adjacent the anode; the electron-transport and light-emitting layer 209 adjacent the hole-transport layer; and the cathode 211 adjacent the electron-transport and light-emitting layer. The cathode may optionally be protected by the protective layer 215.

When electric power is applied, biasing the anode positive with respect to the cathode, light is emitted at the interface 213 between the hole-transport layer 205 and the electron-transport and light-emitting layer 209.

To increase its service life and temperature tolerance, the electroluminescent device 200 according to the invention employs a new hole-transporting polymer as the hole transport layer 205. The hole-transporting polymer is composed of chains of charge transport groups consisting essentially of arylamine molecules which provide the hole conduction. The constitutional repeat unit of the hole-transporting polymer is a pure arylamine group. The constitutional repeat unit contains no other sub-units that could negatively effect the ability of the arylamines to transport charge. For example, the constitutional repeat unit includes no cross-linking groups. The hole-transporting polymer is also soluble in several commonly-available solvents. This enables the hole-transporting polymer to be deposited in thin layers using known techniques for forming thin films from solutions. These coating techniques include spin coating, spray coating, dip coating, roller coating, draw-bar coating and other methods. Finally, the hole-transporting polymer has a glass transition temperature above 100° C. so that it retains its solid form throughout the intended temperature operating range of the electroluminescent devices.

Preferably, the hole-transporting polymer comprises a poly(arylamine) composition. The poly(arylamine) composition will be described in more detail below. In one embodiment the hole-transport layer 205 comprises a specific poly(arylamine) called PPPDA. In another embodiment, the hole-transport layer comprises a different specific poly(arylamine) called MPPDA. In a further embodiment, the hole-transport layer comprises another different specific poly(arylamine) called PPPDA-MeO. These compounds and their fabrication will be described in detail below.

In all embodiments, the substrate 203 is preferably a piece of glass, the translucent anode 201 is preferably comprises indium-tin oxide ("ITO"), and the cathode 211 preferably comprises magnesium or some other metal having a work function of less than about 5 eV. The optional protective layer 215 comprises aluminum, silver, or gold, for example. Alternatively, the optional protective layer may be a layer of an insulator such as $SiO_2$, $SiN_x$ or an insulating polymer.

The electron-transport and light-emitting layer 209 preferably comprises a metal chelated oxinoid compound represented by the structural formula:

Formula (0)

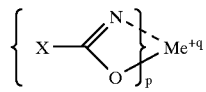

in which Me represents a metal, q is an integer between 0 and 3 and X is independently in each occurrence represents the atoms completing a nucleus having at least two fused aromatic rings, at least one of which is an azole or azine ring. An illustrative list of such compounds is set forth in U.S. Pat. No. 5,089,862 referred to above. Preferably, the electron-transport and light-emitting layer 209 comprises metal chelated oxine. Most preferably, the electron-transport and light-emitting layer 209 comprises aluminum tris-8-hydroxyquinoline ("Alq$_3$"), which emits green light. Different materials may be used for the electron-transport and light-emitting layer if the electroluminescent device is to emit light with a color other than green. Different materials may be used to provide the electron transporting and light emitting properties of the electron-transport and light-emitting layer. The luminous efficiency of the device may be increased by doping the electron-transport and light-emitting layer 209 with a suitable fluorescent dye such as quinacridone.

FIG. 3 illustrates an embodiment that is similar in some respects to the embodiment illustrated in FIG. 2. For convenience, elements of the electroluminescent device 220 shown in FIG. 3 that are similar to elements of FIG. 2 are indicated by the same reference numerals and will not be discussed further. In the embodiment illustrated in FIG. 3, a separate small-molecule hole transport layer 207 is provided, and the polymer layer 205 is interposed between the anode 201 and the small-molecule hole transport layer 207. In this embodiment, the hole-transporting polymer described above is used as the polymer layer 205. Specifically, the polymer layer 205 may comprise PPPDA, MPPDA or PPPDA-MeO.

The small-molecule hole transport layer 207 comprises a tertiary amine containing at least two tertiary amine molecules and including, attached to a tertiary amine nitrogen atom, an aromatic moiety containing at least one aromatic ring or at least two fused aromatic rings. An illustrative list of such compounds is set forth in U.S. Pat. No. 5,089,862 referred to above. These are arylamines with electrochemical and hole-transporting properties similar to those of TPD and suitable for use as the small-molecule hole-transport layer. The small-molecule hole transport layer 207 preferably comprises N,N'-diphenyl-N-N'-bis(3-methylphenyl)-1,1'-biphenyl-4,4'-diamine ("TPD").

An organic electroluminescent device according to the invention is made in a first method according to the invention by steps including coating from solution a layer of the hole-transporting polymer onto a substrate to form a hole-transport layer; vapor-depositing in vacuum an electron-transport and light-emitting layer onto the hole-transport layer; and thermally evaporating in vacuum a conductive cathode layer onto the electron transport layer. If the device being fabricated is similar to either of the embodiments depicted in FIGS. 2 and 3, the substrate already will have been coated with a translucent conductive anodic material such as ITO prior to spin-casting the hole transporting polymer layer.

In a variation on this method, a suitable fluorescent dye may be co-deposited with the material of the electron-transport and light-emitting layer 209 to increase the luminous efficiency of the device.

In another variation on this method, the method additionally includes a step of post-annealing the device following deposition of the cathode layer 211 in a dry nitrogen atmosphere at an elevated temperature.

If the device being fabricated includes the separate small-molecule hole transport layer 207 shown in FIG. 3, then the method of the invention also includes the step of vapor-depositing in vacuum the small-molecule hole transport layer onto the hole-transporting polymer 205. The electron transport layer is then vapor deposited in vacuum onto the small-molecule hole transport layer.

In the above-described electroluminescent devices 200 and 220, the hole-transporting polymer is any poly (arylamine) composition comprising one or more of compounds corresponding to Formula (I) below. Preferably, the hole-transporting polymer is PPPDA, MPPDA, or PPPDA-MeO, which are specific forms of the compounds corresponding to formula I below.

In the compounds corresponding to Formula (I), R is preferably independently in each occurrence a $C_{1-12}$ hydrocarbyl, $C_{1-12}$ alkoxy, $C_{1-12}$ thioalkoxy, $C_{1-12}$ aryloxy, $C_{1-12}$ thioaryloxy moiety or a $C_{1-12}$ hydrocarbyl moiety which is optionally substituted with a $C_{1-12}$ alkoxy, $C_{1-12}$ thioalkoxy, $C_{1-12}$ aryloxy, and $C_{1-12}$ thioaryloxy moiety. More preferably, R is independently in each occurrence a $C_{1-5}$ alkoxy, $C_{1-5}$ thioalkoxy or a $C_{1-6}$ hydrocarbyl. Most preferably, R is independently in each occurrence methyl or methoxy.

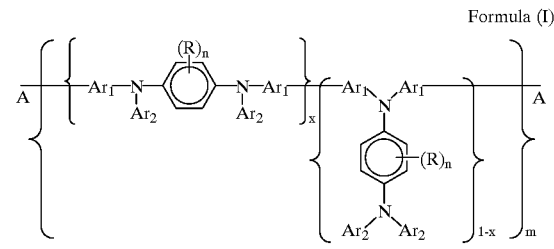

Formula (I)

Preferably, Ar$_1$ and Ar$_2$ are independently in each occurrence a $C_{6-18}$ aromatic radical optionally substituted with $C_{1-12}$ hydrocarbyl, $C_{1-12}$ alkoxy, $C_{1-12}$ thioalkoxy, $C_{1-12}$ aryloxy, and $C_{1-12}$ thioaryloxy moieties. More preferably, Ar$_1$ and Ar$_2$ are independently in each occurrence a phenyl, naphthyl or biphenyl group, optionally substituted with $C_{1-5}$ alkoxyl or $C_{1-6}$ alkyl. Even more preferably, Ar$_1$ and Ar$_2$ are independently in each occurrence derived from anisole, methoxynapthalene, methoxybiphenyl, phenyl or toluene. Most preferably, Ar$_1$ is phenyl and Ar$_2$ is independently in each occurrence 4-methoxyphenyl or phenyl. Preferably, A is independently in each occurrence hydrogen, chlorine, or bromine. Preferably, x is a positive number between 0 and 1. Preferably, n is a whole number from 0 to 4. More preferably, n is a number from 0 to 1. Most preferably, n is a number of 0. Finally, m is a number from about 5 to about 500. More preferably, m is a number of from about 5 to about 100.

In PPPDA, x=1, n=0, Ar$_1$=1,4-phenylene, Ar$_2$=phenyl, and m=5 to 500.

In MPPDA, x=1, n=0, Ar$_1$=1,3-phenylene, Ar$_2$=phenyl, and m=5 to 500.

In PPPDA-MeO, x=1, n=0, Ar$_1$=1,4-phenylene, Ar$_2$=4-methoxyphenyl, and m=5 to 500.

The poly(arylamines) that are preferably used as the hole-transporting polymer in the electroluminescent devices of the invention demonstrate strong photoluminescence in dilute solutions or in the solid state. When such materials are exposed to light of a wavelength of about 300 to about 700 nanometers, the materials emit light of wavelengths in the region of about 400 to about 800 nanometers. More preferably, such materials absorb light of wavelengths of from about 300 to about 400 nanometers and emit light of wavelengths in the region of about 400 to about 650 nanometers. These poly(arylamines) are readily soluble in common organic solvents. They can be processed into thin films or coatings by conventional techniques. These poly (arylamines) preferably have oxidation potentials of about +0.1 volt or greater, more preferably +0.4 volt or greater and preferably +1.0 volt or less, more preferably +0.7 volt or less.

The poly(arylamines) that are preferably used as the hole-transporting polymer in the electroluminescent devices according to this invention preferably have a weight average molecular weight of about 250 Daltons or greater, more preferably about 500 Daltons or greater, even more preferably about 1,000 Daltons or greater; preferably about 1,000,000 Daltons or less, more preferably about 500,000 Daltons or less and most preferably about 50,000 Daltons or less. Molecular weights are determined according to gel permeation chromatography using polystyrene standards.

Preferably, the poly(arylamines) demonstrate a polydispersity ($M_w/M_n$) of 5 or less, more preferably 4 or less, even more preferably 3 or less and most preferably 2.5 or less.

The monomers useful in the preparation of the poly (arylamines) preferably comprise two amino moieties wherein each amino moiety is bound to three aryl moieties wherein two halo moieties are optionally bound to the monomers. Preferably, the poly(arylamines) comprise from about 5 to about 1000 of the monomers. Preferably, the monomers useful in the preparation of the poly(arylamines) of this invention are illustrated in Formulas (II) and (III):

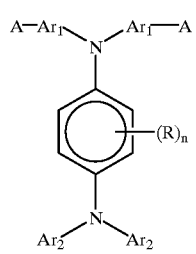

Formula (II)

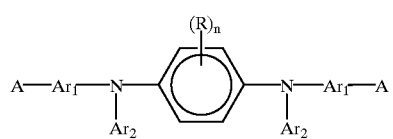

Formula (III)

in which A, $Ar_1$, $Ar_2$, R and n are as defined above. A preferred monomer is dihalogenated N,N,N',N'-tetraaryl-1, 4-phenylenediamine. Such halogenated monomers may be prepared, for example, by contacting one or more diaryldiamines with a haloaromatic compound under reaction conditions sufficient to form the corresponding monomer of Formula (II) or (III). Diaryldiamines useful for this purpose are shown in Formulas (IV) and (V).

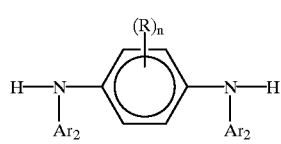

Formula (IV)

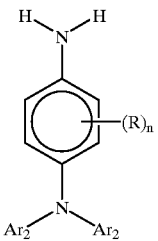

Formula (V)

In these, A, $Ar_1$, $Ar_2$, R and n are as defined above. Such diaryldiamines may be compounds such as N,N'-diaryl-1,4-phenylenediamine or N,N'-diaryl-1,4-phenylenediamine.

The diaryldiamines are contacted with a haloaromatic compound under conditions such that one or more monomers are prepared. Preferably, the contacting of the diaryldiamines with a haloaromatic compound is performed according to the procedures of Gauthier and Frechet in SYNTHESIS, p.383 (1987), incorporated herein by reference, or according to the procedures of Guram, Rennels and Buchwald, ANGEWANDTE CHEMIE INTERNATIONAL EDITION IN ENGLISH, Vol.34, p.1348 (1995), incorporated herein by reference. The diaryldiamines and haloaromatic compounds are contacted and heated in the presence of copper powder and potassium carbonate. Alternatively, the contacting is performed in the presence of sodium t-butoxide and a catalyst comprising a palladium compound and tri-o-tolylphosphine. Preferably, if copper powder and potassium carbonate are used as starting materials, an iodoaromatic compound may be used. Preferably, if sodium t-butoxide and a catalyst comprising a palladium compound and tri-o-tolylphosphine are used as starting materials, a bromoaromatic compound may be used.

The haloaromatic compound includes compounds of Formula (VI):

$$A\text{—}Ar_1\text{—}B \qquad (VI)$$

in which A and B are independently in each occurrence hydrogen or a halogen and $Ar_1$ is as defined above. Preferably, A is individually in each occurrence hydrogen, chlorine or bromine and B is individually in each occurrence bromine or iodine. The amount of haloaromatic compound used is enough to fully substitute the amine nitrogen atoms of the diaryldiamine present in the reactant mixture. Preferably, the diaryldiamines are contacted with a haloaromatic compound in a mole ratio of about 1:10 or less, more preferably in a ratio of about 1:5 or less and even more preferably in a ratio of about 1:3 or less.

The reactants to prepare the monomers are heated to a temperature at which the reaction proceeds at a rate sufficient to form the monomers. Preferably, the reaction temperature is about 100° C. or greater, more preferably about 120° C. or greater and even more preferably about 150° C. or greater. Preferably, the reaction temperature is about 300° C. or less, more preferably about 250° C. or less and even more preferably about 200° C. or less. The reaction time is dependent upon the reaction temperature, the amount of catalyst and the concentration of the reactants. Reaction times are preferably about 5 hours or greater, more preferably about 10 hours or greater and even more preferably about 20 hours or greater. Reaction times are about 50 hours or less, more preferably about 40 hours or less and most preferably about 30 hours or less.

The amount of solvent used in this process can vary over a wide range. Generally, it is desired to use as little solvent as possible. Preferably, about 1 liter or less of solvent per mole of diaryldiamines is used, more preferably about 0.5 liter or less is used, and most preferably about 0.1 liter or less is used. The lower limit on amount of solvent used is determined by practicality, that is, handleability of the solution and solubility of the reactants and products in the solvent.

The poly(arylamines) preferably used as the hole-transporting polymer of the electroluminescent devices according to the invention may be prepared by a halide coupling reaction (a "polymerization reaction") carried out in the presence of a catalytic amount of a divalent nickel salt, at least a stoichiometric amount of zinc powder, a trisubstituted phosphine and an amount of a compound capable of accelerating the coupling reaction in a polar solvent and an optional co-solvent comprising an aromatic hydrocarbon or ether. The nickel (zero valent) catalyst is prepared in situ by contacting a divalent nickel salt with a reducing agent in the presence of a material capable of acting as a ligand and, optionally, a material capable of accelerating the reactions.

The poly(arylamines) preferably used as the hole-transporting polymer in the electroluminescent devices according to the invention are preferably prepared by contacting the monomers in the presence of a nickel catalyst according to the procedures of Colon et al., described in JOURNAL OF POLYMER SCIENCE, Part A, Polymer Chemistry Edition, Vol. 28, p. 367 (1990), incorporated herein by reference, and Colon et al., JOURNAL OF ORGANIC CHEMISTRY, Vol. 51, p. 2627 (1986), the relevant parts of which are incorporated herein by reference.

The polymerization reaction is preferably carried out in a polar solvent, preferably dimethylformamide, N,N-dimethylacetamide, N-cyclohexylpyrrolidinone or N-methylpyrrolidinone. Up to about 50 volume percent of a non-amide co-solvent can be used. Preferable co-solvents are aromatic hydrocarbons and ethers, for instance, tetrahydrofuran. The process is preferably conducted in the absence of oxygen and moisture, as the presence of oxygen is detrimental to the catalyst and the presence of a significant amount of water leads to premature termination of the process. More preferably, the reaction is performed under an inert atmosphere such as nitrogen or argon.

The catalyst is preferably formed from a divalent nickel salt. The nickel salt may be any nickel salt which can be converted to the zero valent state under reaction conditions. The preferred nickel salts are the nickel halides, with nickel chloride and nickel bromide most preferred. The divalent nickel salt is present in an amount of about 0.01 mole percent or greater, more preferably about 0.1 mole percent or greater and most preferably about 1.0 mole percent or greater based on the amount of monomer present. The amount of divalent nickel salt present is preferably about 30 mole percent or less, more preferably about 15 mole percent or less, based on the amount of monomer present.

The nickel-catalyzed polymerization reaction is performed in the presence of a material capable of reducing the divalent nickel ion to the zero valent state. Suitable material includes any metal that is more easily oxidized than nickel. Preferable metals include zinc, magnesium, calcium and lithium. The preferred reducing agent is zinc in the powder form. At least stoichiometric amounts of reducing agent based on the amount of nickel is required to maintain the nickel species in the zero valent state throughout the reaction. Preferably, the reducing agent is present in an amount of about 150 mole percent or greater, more preferably about 200 mole percent or greater, and most preferably about 250 mole percent or greater, based on the amount of monomer used. Preferably, the reducing agent is present in an amount of about 500 mole percent or less, more preferably about 400 mole percent or less and most preferably about 300 mole percent or less, based on the amount of monomer.

The polymerization reaction is performed in the presence of a material capable of acting as a ligand. Preferred ligands include trihydrocarbylphosphines. More preferred ligands are triaryl or trialkylphosphines, with triphenylphosphines being the most preferred. The compound capable of acting as a ligand is present in an amount of from about 10 mole percent or greater, more preferably about 20 mole percent or greater, based on the amount of monomer. The compound capable of acting as a ligand is preferably present in an amount of about 100 mole percent or less, more preferably about 50 mole percent or less, and most preferably about 40 mole percent or less, based on the amount of monomer.

The polymerization reaction can be performed at any temperature at which the reaction proceeds at a reasonable rate. Preferably, the reaction is performed at a temperature of about 25° C. or greater, more preferably about 50° C. or greater, and most preferably about 70° C. or greater. Below about 25° C., the rate of reaction is unacceptably low. Preferably, the reaction is performed at a temperature of about 200° C. or less, more preferably about 150° C. or less, and most preferably about 125° C. or less. Temperatures substantially higher than about 200° C. can lead to degradation of the catalyst. The reaction time is dependent upon the reaction temperature, the amount of catalyst and the concentration of the reactants. Reaction times are preferably about 1 hour or greater and more preferably about 10 hours or greater. Reaction times are about 100 hours or less, more preferably about 72 hours or less and most preferably about 48 hours or less. The amount of solvent used in this process can vary over a wide range. Generally, it is desirable to use as little solvent as possible. Preferably, about 10 liters of solvent per mole of monomer or less are used, more preferably about 5 liters or less are used, and most preferably about 2 liters or less are used. The lower limit on amount of solvent used is determined by practicality, that is, handleability of the solution and solubility of the reactants and products in the solvent.

The poly(arylamines) preferably used as the hole-transporting polymer in the electroluminescent devices according to the invention may be prepared by a process disclosed in Ioyda et al., BULLETIN OF THE CHEMICAL SOCIETY OF JAPAN, Vol. 63, p. 80 (1990), relevant parts of which are incorporated herein by reference. This method is similar to the method described above. In particular, the catalyst is a divalent nickel salt introduced as a nickel halide bis-triphenylphosphine complex. The reaction may be performed in a variety of polar solvents. These solvents can include acetone, dimethylformamide, tetrahydrofuran and acetonitrile. The reaction is accelerated by the addition of about 10 mole percent of an organo-soluble iodide such as tetraethylammonium iodide. The reaction is performed at a temperature from about 20° C. to about 100° C. for about one to about 24 hours.

The poly(arylamines) preferably used as the hole-transporting polymer in the electroluminescent devices according to the invention may alternatively be prepared using the process disclosed by Yamamoto, PROGRESS IN POLYMER SCIENCE, Vol. 17, p. 1153 (1992), relevant parts of which are incorporated herein by reference. This method is similar to the method described above. In this process, the monomers are contacted with at least a stoichiometric amount of nickel catalyst in the form of nickel (1,5-cyclooctadiene) complex and at least a stoichiometric amount of 1,5-cyclooctadiene as a ligand in an inert solvent, such as tetrahydrofuran. The reaction is preferably conducted at about 70° C. or higher for about two or more days.

Another way of making the poly(arylamines) preferably used as the hole-transporting layer in the electroluminescent devices according to the invention is the process disclosed in Miyaura et al., SYNTHETIC COMMUNICATION, Vol. 11, p. 513 (1981), and Wallow et al., AMERICAN CHEMICAL SOCIETY, POLYMER PRE-PRINT, Vol. 34 (1), p. 1009 (1993). Relevant parts of both references are incorporated herein by reference. In this process, the halogens on the monomers are converted to the corresponding lithio- or Grignard moieties. Such processes are well known in the art, see, for example, March, ADVANCED ORGANIC CHEMISTRY, 2d Ed., pp. 408–414 (McGraw-Hill, 1977). The resulting lithio- or Grignard derivatives are reacted with a trialkyl borate to form the corresponding boronic acid: M. Rehalin et al., as disclosed in MAKROMOLECULAIRE CHEMIE, Vol. 191, pp. 1991–2003 (1990), the relevant parts of which are incorporated herein by reference. The resulting boronic acid derivatives are contacted in the presence of a catalytic amount of tetrakis(triphenylphosphine)-palladium (0) and an aqueous base under conditions such that the poly(arylamines) of the invention are prepared.

The tetrakis(triphenylphosphine)-palladium (0) may be generated in situ by adding a soluble palladium salt, for example, palladium acetate or palladium chloride, and at least four molar equivalents of triphenylphosphine. The catalyst is present in a sufficient amount to promote the desired reaction and to facilitate a reasonable rate of reaction. Preferably, the catalyst is present in an amount of about 0.01 mole percent or greater, more preferably about 0.1 mole percent or greater, and most preferably about 1.0 mole percent or greater, based on the amount of monomer present. The tetrakis(triphenylphosphine)-palladium (0) is preferably present in an amount of about 20 mole percent or less, more preferably about 10 mole percent or less, and most preferably about 5 mole percent or less, based on the amount of monomer.

The above reactants are contacted in a solvent that does not react with the reactants or deactivate the catalysts. Preferred solvents include aromatic hydrocarbons, lower alkanols, aliphatic ethers and N,N-dialkylamides, with toluene and ethanol being more preferred.

The process as disclosed in Miyaura et al. is preferably conducted in the absence of oxygen, as the presence of oxygen is detrimental to the catalyst. More preferably, the reaction is performed in an inert atmosphere such as nitrogen or argon.

The above reaction can be performed at any temperature at which the reaction proceeds at a reasonable rate. Preferably, the reaction is performed at a temperature of about 50° C. or greater, more preferably about 70° C. or greater, and most preferably about 80° C. or greater. Below about 50° C., the rate of reaction is unacceptably low. Preferably, the reaction is performed at a temperature of about 150° C. or less, more preferably about 130° C. or less, and most preferably about 100° C. or less. Temperatures substantially higher than about 150° C. can lead to degradation of the catalyst. The reaction time is dependent upon the reaction temperature, the amount of catalyst and the concentration of the reactants. Reaction times are preferably about 10 hours or greater and more preferably about 20 hours or greater. Reaction times are about 100 hours or less, more preferably about 50 hours or less, and most preferably about 20 hours or less. The amount of solvent used in this process can vary over a wide range. Generally, it is desirable to use as little solvent as possible. Preferably, about 100 liters of solvent per mole of diaryldiamine or less is used, more preferably about 75 liters or less, and most preferably about 50 liters or less. The lower limits on amount of solvent used is determined by practicality, that is, handleability of the solution and solubility of the reactants and products in the solvent.

The poly(arylamines) resulting from all of the above methods of preparation are recovered using conventional techniques; preferred techniques include filtration and precipitation using a non-solvent.

The poly(arylamines) form good pinhole- and defect-free layers. Such layers can be prepared in ways well known in the art, including spin-coating, spray-coating, dip coating, roller-coating, and draw bar coating. Such coatings are prepared by applying a composition to a substrate and exposing the applied composition to conditions such that a thin layer is formed. For example, the composition applied to the substrate may be the poly(arylamines) dissolved in a common organic solvent. Preferred solvents are aliphatic hydrocarbons, chlorinated hydrocarbons, aromatic hydrocarbons, ketones, ethers and the like. It is preferable that the solvent have a relatively low polarity. Preferably, the solution contains from about 0.5 to about 10 weight percent of the poly(arylamine). For thin layers, it is preferred that the composition contain from about 0.5 to about 5.0 percent by weight of the poly(arylamine). This composition is then applied to the appropriate substrate by the desired method. The resulting thin layers are preferably substantially uniform in thickness and substantially free of pinholes.

EXAMPLES OF MAKING EXEMPLARY HOLE-TRANSPORTING POLYMERS

The following examples are included for illustrative purposes only and do not limit the scope of the claims. Unless otherwise stated, all parts and percentages are by weight.

Example 1—Preparation of PPPDA-MeO (a) Preparing the monomer: N,N'-diphenyl-N,N'-di-(4-methoxyphenyl)-1,4-phenylenediamine, a starting monomer for making PPPDA-MeO.

N,N'-diphenyl- 1,4-phenylenediamine (46.3 g, 0.18 mol), 4-iodophenyl-methylether (100.0 g, 0.43 mol), copper bronze powder (28 g, 0.44 mol), potassium carbonate (166 g, 1.2 mol), 18-crown-6 ether (7.9 g, 0.03 mol) and 1,2-dichlorobenzene (400 ml) are added to a reactor equipped with a mechanical stirrer, and a nitrogen inlet and condenser are added. The mixture is heated at 180° C. for 90 hours and the water produced by the reaction is removed with a slow flow of nitrogen. After 24 hours, the hot reaction mixture is filtered through a bed and concentrated under reduced pressure to produce a dark brown viscous liquid. This liquid is percolated through a bed of silica gel with hexane to remove some of the color. Recrystallization twice from acetone produces 55.7 g (66%) of tan-colored crystals of the monomer.

(b) Preparing the monomer: N,N'-di-(4-bromophenyl)-N,N'-di-(4-methoxyphenyl)-1,4-phenylenediamine, a starting monomer for making PPPDA-MeO.

A solution of N-bromosuccimide (19.0 g, 0.11 mol) and dimethyl formamide (DMF) (150 ml) is added to a stirred solution of N,N'-diphenyl-N,N'-di-(4-methoxyphenyl)-1,4-phenylenediamine (25.0 g, 0.053 mol) in DMF (150 ml). The reaction mixture is added to 1 l of toluene and heated to 60° C. The warm solution is washed with water (4×1000 ml)

at 60° C. The toluene solution is dried over anhydrous MgSO$_4$, filtered through a bed of silica gel, then concentrated under reduced pressure. Two recrystallizations of the crude product from toluene/hexane results in tan-colored crystals of the monomer (21.6 g, 65%) after drying.

(c) Polymerizing N,N'-di-(4-bromophenyl)N,N'-di-(4-methoxyphenyl)- 1,4-phenylenediamine to make PPPDA-MeO.

A polymerization reactor is charged with N,N'-di-(4-bromophenyl)-N,N'-di-( 4-methoxyphenyl)-1,4-phenylenediamine (6.3 g, 10 mmol), triphenylphosphine (1.35 g, 5 mmol), zinc powder (2.0 g, 30 mmol) and nickel chloride-2,2'-bipyridine complex (NiCl$_2$-Bipy) (0.1 g, 0.45 mmol). The reactor is evacuated to ~0.2 mm Hg and then purged with nitrogen. This cycle is repeated 7 times. A syringe is used to add 20 ml of anhydrous dimethyl acetamide (DMAc) to the reactor. The reaction mixture is heated to 80° C. with a stirring rate of 250 rpm. After a few minutes the reaction mixture will turn from gray to a brownish-red color which will become darker with time. After 1 hour, a solid green cake will form and mixing will become difficult. 25 ml of DMAc and 40 ml of toluene are added to the reactor to dissolve the solid cake. The reaction is stirred at 80° C. for 18 hours. The reaction mixture is added to 500 mg of acetone, precipitating out the product. The precipitate is collected and washed with acetone (3×150 ml). The precipitate is dissolved in 300 ml of chlorobenzene then filtered through a bed of filter aid. The chlorobenzene solution is washed with 300 ml of aqueous 3N HCl and water (2×300 ml). The chlorobenzene mixture is then added to a flask containing 100 ml of water and 50 ml of ethylenediamine. The mixture is stirred at 60° C. for two hours. The aqueous layer of the chlorobenzene mixture is removed and the toluene layer of the chlorobenzene mixture washed with water (3×200 ml). The chlorobenzene mixture is concentrated to a volume of ~50 ml, then slowly added to 300 ml of acetone. The polymer is formed as a yellow precipitate. The yellow precipitate is collected, washed with acetone (2×200 ml) then dried to produce 4.4 g (94%) of a yellow powder.

(d) Alternative Way of Polymerizing N,N'-di-(4-bromophenyl)-N,N'-di-(4-methoxyphenyl)-1,4-phenylenediamine to make PPPDA-MeO.

The above example is repeated using N,N'-di-(4-bromophenyl)-N,N'-di-(4-methoxyphenyl)-1,4-phenylenediamine (6.3 g, 10 mmol), triphenylphosphine (1.31 g, 50 mmol), zinc powder (2.0 g, 30 mmol), NiCl$_2$-Bipy (0.086 g, 0.3 mmol), and N-methylpyrrolidinone (20 ml). Polymerization is terminated after about six hours. The polymer cake is dissolved in toluene (200 ml) and the resulting mixture filtered through a bed to remove the inorganic salts. The filtered toluene solution is reduced to about 50 ml volume and is then poured into about 800 ml of acetone to precipitate the desired polymer. The solid is collected by filtration and dried in a vacuum oven overnight at 60° C. to give 3.47 g of yellow polymer whose inherent viscosity in toluene is 0.08 dl/g.

(e) Alternative Way of Polymerizing N,N'-di-(4-bromophenyl)N,N'-di1-(4-methoxyphenyl)-1,4-phenylenediamine to make PPPDA-MeO.

The above example is repeated with N,N'-di-(4-bromophenyl)-N,N'-di-(4-methoxyphenyl)-1,4-phenylenediamine (3.15 g, 5 mmol), triphenylphosphine (0.66 g, 25 mmol), zinc powder (1.00 g, 15 mmol), NiCl$_2$-Bipy (0.05 g, 0.17 mmol), and N-cyclohexylpyrrolidinone (11 ml). Polymerization is carried out for 25 hours at 90° C. and the polymer product (2.0 g, inherent viscosity 0.09 dl/g) is isolated by the same procedure described above.

Example 2—Preparing MPPDA.

(a) Preparing the monomer: N,N'-Di phenyl-N,N'-di-(3-chlorophenyl)- 1,4-phenylenediamine, a starting monomer for making MPPDA.

Following the procedure of Example 1, a mixture of N,N'-diphenyl-1,4-phenylenediamine (13.0 g, 0.05 mol), 3-iodochlorobenzene (3 1.0 g, 0.13 mol), copper bronze powder (7.5 g, 0.13 mol), 18-crown-6 (2.40 g 0.09 mol), powdered potassium carbonate (50.14 g, 0.36 mol) and 1,2-dichlorobenzene (120 ml) is heated for 20 hours at 190° C. The hot reaction mixture is filtered through a bed washed with toluene (50 ml). Toluene is removed under vacuum from the combined filtrate and the resulting dark brown oil is chromatographed on a silica gel column (5×25 cm, 5% CH$_2$Cl$_2$ in hexane as eluant) to give 7.4 g (31%) of a light yellow viscous oil which will solidify upon standing. Recrystallization from methanol-acetone produces 4.6 g (19%) of monomer product as white flakes (m.p. 124° C.~127° C.).

(b) Preparing the monomer product: N,N'-Diphenyl-N,N'-di-(3-chlorophenyl)-1,4-phenylenediamine.

A mixture of palladium acetate (180 mg, 0.8 mmol) and tri-o-tolylphosphine (536 mg, 1.7 mmol) and toluene (40 ml) is stirred at ambient temperature for 30 min. until a homogenous yellow solution is formed. N,N'-diphenyl-1,4-phenylenediamine (5.2 g, 20 mmol), 3-bromochlorobenzene (9.6 g, 50 mmol), sodium tert-butoxide (5.4 g, 56 mmol) and more toluene (120 ml) is added to the above mixture in a reactor vessel. With a slow purge of nitrogen, the reaction vessel is placed into an oil-bath and the stirred reaction is heated to reflux for 14 hours. The reaction mixture is cooled to ambient temperature, treated with hydrochloric acid (6 ml), and filtered through a bed. Removing the solvent on a rotavapor under reduced pressure produced a dark brown viscous oil. Flash chromatography on a silica gel column (5×25 cm, 10% toluene in hexane as eluent) provided a light-yellow oil, which solidified on standing at ambient temperature. Recrystallization from methanol/acetone produced 7.3 g (76%) of product as white flakes (m.p. 125° C.–127° C.).

(c) Polymerizing N,N'-diphenyl-N,N'-di-(3-chlorophenyl)-1,4-phenylenediamine to make MPPDA.

N,N'-diphenyl-N,N'-di-(3-chlorophenyl)-1,4-phenylenediamine (1.2 g, 2.5 mmol), triphenylposphine (327.5 mg, 1.25 mmol), zinc powder (490 mg, 7.5 mmol) and NiCl$_2$-Bipy (21.5 ng, 0.075 mmol) are added to a dry reactor. The reactor is evacuated to −3 mm/Hg and is then filled with nitrogen. This cycle is repeated five times. 3.5 ml of N-methylpyrrolidinone is added to the reactor and the reactor is evacuated and filled with nitrogen 3 times. T he reaction mixture is stirred and heated in an oil bath at 70° C. for 20 hours. The polymer cake thus formed is dissolved in hot chlorobenzene (40 ml). T he solution is filtered and concentrated to about 10 ml. Acetone (100 ml) is added to the solution to precipitate the polymer as a white powder. Washing with acetone and drying in a vacuum oven at 60° C. overnight will give 0.78 g (76%) of polymer product.

(d) Polymerizing N,N'-diphenyl-N,N'-di-(3-chlorophenyl)-1,4-phenylenediamine to make MPPDA.

Example (c) is repeated using ten times the amounts of all solid reagents. N-cyclohexyl-pyrrolidinone (13 ml) and N-methylpyrrolidinone (23 ml) are used as the solvent. Polymerization is conducted at 70° C. for 8 hours and 90° C. for 10 hours. The yield of polymer is 8.7 g (85%).

(e) Polymerizing N,N'-diphenyl-N,N'-di-(3-chlorophenyl)-1,4-phenylenediamine to make MPPDA.

Example (c) is repeated except that the solvent is a 1:1 mixture of N-cyclohexyl-pyrrolidinone and N-methylpyrrolidinone (total 4 ml). Polymerization is allowed to proceed for 10 hours at 70° C. The product (910 mg, 88%) isolated will have an inherent viscosity of 0.13 de/g in $CH_2CH_2$.

Example 3—Making PPPDA (a) Making N,N'-Diphenyl-N,N'-di-(4-chlorophenyl)-1,4-phenylenediamine, a monomer for making PPPDA.

A mixture of palladium acetate (270 mg, 1.2 mmol) and tri-o-tolylphosphine (804 mg, 2.6 mmol) and toluene (20 ml) is stirred at ambient temperature for 30 min. until a homogenous yellow solution is formed. To this solution are added N,N'-diphenyl-1,4-phenylenediamine (7.8 g, 30 mmol), 4-bromochlorobenzene (18.9 g, 99 mmol), sodium tert-butoxide (8.1 g, 84 mmol) and more toluene (250 ml). With a slow purge of nitrogen, the reaction vessel is placed into an oil-bath and the stirred reaction is heated to reflux for 12 hours. The reaction mixture is cooled to ambient temperature, treated with hydrochloric acid (9 ml), and filtered through a bed of filtering aid. Removal of the solvent on a rotavapor under reduced pressure produces a dark brown viscous oil. Flash chromatography on a silica gel column (5×25 cm, 50% benzene/hexane as eluent) provides a light-yellow solid. Recrystallization of the benzene/hexane will produce about 11.9 g (82%) of product as white flakes.

(b) Making N,N'-Diphenyl-N,N'-di-(4-chlorophenyl)- 1,4-phenylenediamine.

A one liter, three-necked, round-bottomed flask, equipped with an overhead stirrer, a nitrogen inlet and a reflux condenser, is charged with N,N'-diphenyl-1,4-phenylenediamine (13.0 g, 0.05 mol), 4-iodochlorobenzene (31.0 g, 0.13 mol), copper bronze powder (12.7 g, 0.20 mol), 18-crown-6 ether (2.6 g, 0.10 mol), powdered potassium carbonate (50.1 g, 0.36 mol) and 1,2-dichlorobenzene (120 ml). With a slow purge of nitrogen through the condenser, the reaction vessel is placed in an oil bath and the stirred reaction is heated at 200° C. for 20 hours. The hot reaction mixture is filtered through a bed of filtering aid washed with toluene (50 ml), and the filtrate is concentrated on a rotavapor under reduced pressure. The solvent residue is further removed with a Kugelrohr apparatus to produce a dark brown viscous oil. Flash chromatography on a silica gel column (5×25 cm, 5% $CH_2Cl_2$ in hexane as eluent) produces 9.6 g of grey-white solid. The crude product is further washed with toluene and acetone to provide 6.1 g (25%) of off-white powdered material.

(c) Polymerizing N,N'-diphenyl-N,N'-di-(4-chlorophenyl)-1,4-phenylenediamine to make PPPDA.

To a dry reactor equipped with a mechanical stirrer, a nitrogen/vacuum inlet, and a rubber septum are added N,N'-diphenyl-N,N'-di-(4-chlorophenyl)-1,4-phenylenediamine (12.0 g, 25.0 mmol), triphenylphosphine (3.3 g, 12.6 mmol), zinc powder (4.9 g, 75 mmol), and $NiCl_2$-Bipy (0.22 g, 0.75 mmol). The reactor is evacuated to −3 mm Hg and then purged with nitrogen. This cycle is repeated five times. A syringe is used to add 45 ml of N-cyclohexylpyrrolidinone and 27 ml of N-methylpyrrolidinone to the reactor. The reactor is evacuated and purged with nitrogen another three times. The reaction is heated to 70° C. in an oil bath with a stirring rate of 300 rpm. The grey heterogeneous mixture will turn gradually to a red-brown liquid which becomes more and more viscous with time. Stirring is continued at 70° C. for 10 hours and at 90° C. for 10 hours. At the end of the reaction, a dark green-brown viscous material will be observed. The crude product is dissolved in hot chlorobenzene (300 ml), filtered through a short alumina column to remove the zinc dust. The filtrate is concentrated on a rotavapor to ~100 ml and the solution is again passed through an alumina column eluted with THF. The volume of the solution is reduced to ~100 ml and the polymer is precipitated with acetone (500 ml). The product is collected by filtration, washed with acetone and dried in a vacuum oven at 60° C. overnight to give 9.53 g (93%) of light-yellow powder.

EXAMPLES OF ELECTROLUMINESCENT DEVICES

Example 1 (Prior Art)

A translucent anode of indium tin oxide coated glass with sheet resistance of 15 Ω/□ was washed with a water-based detergent, followed by acetone and isopropyl alcohol rinses. Then, a TPD hole transport layer with a thickness of 600 Å was deposited on the anode by vacuum deposition at the rate of 5 Å/sec. TPD was evaporated from a RADAK II vacuum evaporator with an alumina crucible heated by a tungsten filament. An electron-transporting and light-emitting layer of $Alq_3$, also with thickness 600 Å, was also deposited on top of the TPD layer at the rate of 5 Å/sec. The $Alq_3$ was also evaporated from a RADAK II vacuum evaporator. Finally, a cathode consisting of 1000 Å Mg was deposited on top of the $Alq_3$ layer, followed by 1000 Å Ag protecting layer.

When the resulting organic electroluminescent device was operated in a $N_2$-rich dry box under constant direct current of 40 $mA/cm^2$, its initial output luminance was 1200 $cd/m^2$ and the voltage between the anode and cathode was 5.2 volts. However, the device exhibited poor reliability. A catastrophic failure occurred in less than 5 hours of continuous operation, and the device stopped emitting light.

The heat resistance characteristics of another sample were tested by testing the current and luminance characteristics, post-annealing the sample at 80° C. for 24 hours, and re-testing the current and luminance characteristics. The characteristics measured after post annealing were markedly inferior to those measured before post annealing, indicating that the sample had poor heat resistance characteristics.

Example 2

Example 1 was repeated, except that a hole-transporting polymer layer was spun on the ITO/glass substrate prior to the TPD vacuum deposition to produce the device structure shown in FIG. 3. The hole-transporting polymer layer was 550 Å of PPPDA-MeO.

When the resulting organic electroluminescent device was operated in a $N_2$-rich dry box under constant direct current of 40 $mA/cm^2$, its initial output luminance was about 990 $cd/m^2$ and the voltage between the anode and cathode was 8 volts. The device exhibited improved reliability—in about 100 hours of continuous operation, no catastrophic failure occurred. However, the luminance of the device dropped to about one fourth of the initial value ($L/L_o$=0.25), i.e., to about 240 $cd/m^2$. Moreover, the device failed catastrophically after 110 hours of stress. The heat resistance characteristics of this example were not tested.

Example 3

Example 2 was repeated, except that the evaporated TPD layer was omitted. Thus, the device had the structure shown in FIG. 3. Also, the ITO/PPPDA-MeO substrate was annealed at 90° C. for 10 min. to remove the remaining solvents prior to depositing the $Alq_3$ layer.

When the resulting organic electroluminescent device was operated in a $N_2$-rich dry box under constant direct current of 40 mA/cm$^2$, its initial output luminance was about 100 cd/M$^2$ and the voltage between the anode and cathode was 10.5 V. This device had low efficiency, and non-uniform emission was observed from the active area of the device. Under continuous operation, the device had a very limited lifetime and its luminance decayed rapidly.

Example 4

Example 2 was repeated, except that the polymer layer was 1000 Å of PPPDA.

When the resulting organic electroluminescent device was operated in a N$_2$-rich dry box under constant direct current of 40 mA/cm$^2$, its initial output luminance was about 1230 cd/M$^2$ and the voltage between the anode and cathode was 8.2 V. The device exhibited improved reliability—in about 100 hours of continuous operation, no catastrophic failure occurred and the luminance of the device dropped to one third of its initial value (L/L$_o$=0.35), i.e., to about 430 cd/m$^2$. At the same time, the voltage across the device increased to about 14.7 V (V/V$_o$=1.8).

Example 5

Example 4 was repeated, except that a polymer layer was 1100 Å of MPPDA. When the resulting organic electroluminescent device was operated in a N$_2$-rich dry box under constant direct current of 40 mA/cm$^2$, its initial output luminance was about 1280 cd/M$^2$ and the voltage between the anode and cathode was 8.8 V. The reliability of the device was similar to that of Example 4.

Example 6

Example 4 was repeated, except that the evaporated TPD layer was omitted, so the device had the structure shown in FIG. 3. Also the substrate/ITO/PPPDA structure was annealed at 120° C. for 10 min. to remove the remaining solvents prior to depositing the Alq$_3$ layer.

When the resulting organic electroluminescent device was operated in a N$_2$-rich dry box under constant direct current of 40 mA/cm$^2$, its initial output luminance was about 400 cd/M$^2$ and the voltage between the anode and cathode was 8 V. The device exhibited lower efficiency but improved reliability with respect to that described in example 4. In about 100 hours of continuous operation no catastrophic failure occurred and the luminance of the device dropped only 60% of the initial value (L/L$_o$=0.60), i.e., to about 240 cd/m$^2$. At the same time the voltage across the device increased to about 12 V (V/V$_o$=1.5). Thus we conclude that exclusion of the TPD layer reduces the efficiency of the device from 3 cd/A to 1 cd/A but increases the stability of the device.

Example 7

Example 6 was repeated, except that the polymer layer was MPPDA. The substrate/ITO/MPPDA structure was also annealed at 120° C. for 10 min. to remove the remaining solvents prior to depositing the Alq$_3$ layer.

When the resulting organic electroluminescent device was operated in a N$_2$-rich dry box under constant direct current of 40 mA/cm$^2$, its initial output luminance was about 850 cd/m$^2$ and the voltage between the anode and cathode was 8.5 V. In about 100 hours of continuous operation, no catastrophic failure occurred. However, the luminance of the device dropped to 30% of the initial value (L/L$_o$=0.30), i.e., to about 255 cd/m$^2$. At the same time, the voltage across the device increased to about 14.5 V (V/V$_o$=1.7). This suggests that devices made using the MPPDA polymer are less stable than devices made using the PPPDA polymer.

Example 8

Example 6 was repeated, except that the completed device was post-annealed in a dry N$_2$ atmosphere at 80° C. for 24 hours after the deposition of the cathode layer.

When the resulting organic electroluminescent device was operated in a N$_2$-rich dry box under constant direct current of 40 mA/cm$^2$ its initial output luminance was about 430 cd/m$^2$ and the voltage between the anode and cathode was 11 V. In about 100 hours of continuous operation, no catastrophic failure occurred and the luminance of the device dropped to 73% of the initial value (L/L$_o$=0.73), i.e., to about 314 cd/m$^2$. At the same time, the voltage across the device increased to about 14.8 V (V/V$_o$=1.35).

This indicates that, although post-annealing increases the operational voltage of the device, it does not affect the efficiency of the device and makes the device more stable during constant current stress. This also indicates that the device structure shown in FIG. 3 composed of layers of ITO/PPPDA/Alq3/Mg/Ag has high heat resistance.

Example 9

Example 7 was repeated, except that the completed device was post-annealed in dry N$_2$ atmosphere at 80° C. for 24 hours after the Ag layer was deposited.

When the resulting organic electroluminescent device was operated in a N$_2$-rich dry box under constant direct current of 40 mA/cm$^2$, its initial output luminance was about 850 cd/m$^2$ and the voltage between the anode and cathode was about 9.1 V. In about 30 hours of continuous operation, no catastrophic failure occurred. However, the luminance of the device dropped to 12% of the initial value (L/L$_o$=0.12), i.e., to about 100 cd/M$^2$. At the same time, the voltage across the device increased to about 10.7 V (V/V$_o$~1.2). This indicates that devices made using the MPPDA show less operating voltage increase as a result of post-annealing, but they are less stable than devices made using the PPPDA polymer. This also indicates that this device structure using the MPPDA polymer has low heat resistance.

Example 10

Although devices having the structure shown in FIG. 2 and using PPPDA as the polymer have high stability under constant current stress, and a device efficiency that was not impaired by annealing at 80° C., the overall efficiency of the device is somewhat low (~1 cd/A). In this example, the device described in Example 6 is modified by doping the Alq$_3$ layer with a highly efficient fluorescent dye. A low concentration (0.2–0.5 wt. %) of quinacridone (QCD) was incorporated in Alq$_3$ layer by coevaporation. Thus the device had the structure ITO/PPPDA/Alq$_3$:QCD/Mg/Ag.

When the resulting organic electroluminescent device was operated in a N$_2$-rich dry box under constant direct current of 40 mA/cm$^2$, its initial output luminance was about 1520 cd/m$^2$ and the voltage across the anode and cathode was about 8 V. The efficiency of this device was 3.8 cd/A, compared with 1.0 cd/A for the device with the undoped Alq$_3$. Other dyes, for example, modified quinacridones, coumarines, pyrans, or rubrenes could also be used.

Example 11

An electroluminescent device was fabricated by forming a film (about 800 Å thick) of PPPDA by spin coating from a 3% solution in chlorobenzene on ITO-glass (20 Ω/□ sheet resistance). This film serves as the hole-transport polymer. A 2% toluene solution of a light-emitting polymer, poly(9,9-disubstituted fluorine-2,7-diyl) was applied on top of the hole transport layer by spin coating to produce a layer about 1000 Å thick. Calcium metal was then deposited on top of the light-emitting polymer by thermal evaporation, serving as the cathode. Upon applying forward bias to the device, blue light was observed when the voltage between the anode and the cathode was about 9 V. Light output of 130 cd/m$^2$ was observed at a voltage of 16 V, and a current density of 10 mA/cm$^2$. A similar device without the hole transport layer produced discernable light at a voltage of about 11 V, and a light output of about 3 cd/M$^2$ at a voltage of 14 V and a current density of 10 mA/cm$^2$. This illustrates the improvement attainable with the electroluminescent device structure according to the invention using the hole transport polymer.

Although this disclosure describes illustrative embodiments of the invention in detail, it is to be understood that the invention is not limited to the precise embodiments described, and that various modifications may be practiced within the scope of the invention defined by the appended claims.

We claim:

1. An organic electroluminescent device, comprising:
   a substrate;
   a first conductive layer on the substrate, the first conductive layer being translucent;
   an electron-transporting and light-emitting layer;
   a second conductive layer adjacent the electron-transporting and light-emitting layer and remote from the first conductive layer, and
   a hole transporting layer sandwiched between the first conductive layer and the electron-transporting and light-emitting layer, the hole-transporting layer comprising a poly(arylamine) including at least one compound of formula (I):

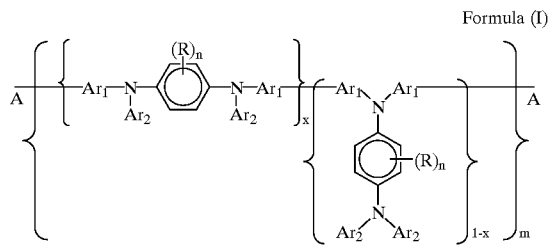

Formula (I)

in which:
   R is independently in each occurrence a $C_{1-24}$ hydrocarbyl, hydrocarboxyl, hydrothiocarboxy, hydroarylcarboxy, or hydrothioarylcarboxy;
   $Ar_1$ and $Ar_2$ are independently in each occurrence a $C_{6-18}$ aryl moiety optionally substituted with one or more $C_{1-24}$ hydroaryl, hydrocarboxyl, hydrothiocarboxy, hydroarylcarboxy, or hydrothioarylcarboxy;
   A is independently in each occurrence hydrogen or a halogen;
   x is independently in each occurrence a positive number between 0 and 1;
   n is a whole number from 0 to 4; and
   m is a number from about 5 to about 1000.

2. The organic electroluminescent device of claim 1, in which the electron transporting and light-emitting layer includes a metal chelated oxinoid compound represented by the structural formula (0):

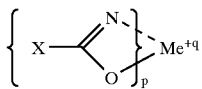

Formula (0)

in which Me represents a metal, q is an integer between 0 and 3 and X independently in each occurrence represents atoms completing a nucleus having at least two fused aromatic rings, at least one of which is an azole or azine ring.

3. The organic electroluminescent device of claim 2, in which the electron transporting and light-emitting layer includes aluminum tris-8-hydroxyquinoline.

4. The organic electroluminescent device of claim 2, in which the electron-transporting and light-emitting layer includes a fluorescent dye.

5. The organic electroluminescent device of claim 1, in which the second conductive layer includes a metal having work function of less than 5 eV.

6. The organic electroluminescent device of claim 1, additionally comprising a layer of an aromatic tertiary amine interposed between the layer of the poly(arylamine) and the electron-transporting and light-emitting layer, the aromatic tertiary amine containing at least two tertiary amine molecules and including, attached to a tertiary amine nitrogen atom, an aromatic moiety containing one of (a) an aromatic ring and (b) at least two fused aromatic rings.

7. The organic electroluminescent device of claim 6, in which the aromatic tertiary amine includes N,N'-diphenyl-N-N'-bis(3-methylphenyl)- 1, 1'-biphenyl-4,4'-diamine.

8. The organic electroluminescent device of claim 1, in which the electron-transporting and light-emitting layer comprises a light-emitting polymer.

9. The organic electroluminescent device of claim 1 or 2, in which x=1, n=0, $Ar_1$=1,4-phenylene, $Ar_2$=phenyl, and m=5 to 1000.

10. The organic electroluminescent device of claim 1 or 2, in which x=1, n=0, $Ar_1$=1,3-phenylene, $Ar_2$=phenyl, and m=5 to 1000.

11. The organic electroluminescent device of claim 1 or 2, in which x=1, n=0, $Ar_1$=1,4-phenylene, $Ar_2$=4-methoxyphenyl, and m=5 to 1000.

12. The organic electroluminescent device of claim 1, in which:
   R is independently in each occurrence a $C_1$ to $C_{12}$ hydrocarbyl, alkoxyl, thioalkoxy, aryloxy, or thioaryloxy moiety optionally substituted with $C_1$ to $C_{12}$ alkoxyl, thioalkoxy, aryloxy, or thioaryloxy moieties;
   $Ar_1$ and $Ar_2$ are independently in each occurrence a $C_6$ to $C_{12}$ aromatic compound optionally substituted with $C_1$ to $C_{12}$ hydrocarbyl, alkoxyl, thioalkoxy, aryloxy, or thioaryloxy moieties;
   A is independently in each occurrence hydrogen, chlorine, or bromine; and
   m is a number of from about 5 to about 500.

13. The organic electroluminescent device of claim 1, in which:
   R is independently in each occurrence a $C_1$ to $C_5$ alkoxy, thioalkoxy or a $C_1$ to $C_6$ hydrocarbyl;
   $Ar_1$ and $Ar_2$ are independently in each occurrence a phenyl, naphthyl or biphenyl, optionally substituted with $C_1$ to $C_5$ alkoxy or $C_1$ to $C_6$ hydrocarbyl;
   A is independently in each occurrence hydrogen, chlorine or bromine;

n is a number of from 0 to 1; and m is a number of from about 5 to about 100.

14. The organic electroluminescent device of claim 1, in which:

R is independently in each occurrence methyl or methoxy;

$Ar_1$ and $Ar_2$ are independently in each occurrence anisole, methoxynapthalene, methoxybiphenyl, or phenyl or toluene;

A is independently in each occurrence hydrogen, chlorine or bromine; and m is a number of from about 5 to about 100.

15. The organic electroluminescent device of claim 1, in which:

$Ar_1$ is independently in each occurrence benzyl;

$Ar_2$ is independently in each occurrence methoxyphenyl or phenyl;

A is independently in each occurrence hydrogen, chlorine or bromine;

n is a number of 0; and m is a number of from about 5 to about 100.

16. A method of making an organic electroluminescent device, the method comprising steps of:

providing:
a substrate having a translucent conductive layer,
a solution of a poly(arylamine) including at least one compound of formula (I):

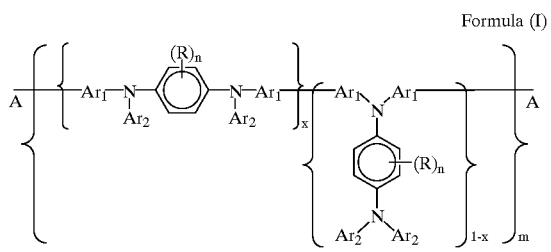

Formula (I)

in which:
R is independently in each occurrence a $C_{1-24}$ hydrocarbyl, hydrocarboxyl, hydrothiocarboxy, hydroarylcarboxy, or hydrothioarylcarboxy;

$Ar_1$ and $Ar_2$ are independently in each occurrence a $C_{6-18}$ aryl moiety optionally substituted with one or more $C_{1-24}$ hydrocarbyl, hydrocarboxyl, hydrothiocarboxy, hydroarylcarboxy, or hydrothioarylcarboxy;

A is independently in each occurrence hydrogen or a halogen;

x is independently in each occurrence a positive number between 0 and 1 inclusive;

n is a whole number from 0 to 4; and m is a number from about 5 to about 1000, an electron-transporting and light-emitting material, and a conductive material; and forming a device structure on the translucent conductive layer by steps including:
coating from the solution a layer of the poly(arylamine) onto the translucent conductive layer,
depositing a layer of the electron-transporting and light-emitting material on the layer of the poly (arylamine), and depositing a layer of the conductive material on the layer of the electron-transporting and light-emitting material.

17. The method of claim 16, in which:

in the providing step, an aromatic tertiary amine is additionally provided, the aromatic tertiary amine containing at least two tertiary amine molecules and including, attached to a tertiary amine nitrogen atom, an aromatic moiety containing one of (a) an aromatic ring and (b) at least two fused aromatic rings;

the step of forming a device structure additionally includes a step of depositing a layer of the aromatic tertiary amine onto the layer of the poly(arylamine) to form a hole-transporting layer; and in the step of depositing a layer of the electron-transporting and light-emitting material, the layer of the electron-transporting and light-emitting material is deposited on the layer of the aromatic tertiary amine.

18. The method of claim 17, in which the aromatic tertiary amine is deposited by vapor deposition in vacuum.

19. The method of claim 17, in which, in the step of providing an aromatic tertiary amine, the aromatic tertiary amine includes N,N'-diphenyl-N-N'-bis(3-methylphenyl)-1, 1'-biphenyl-4,4'-diamine.

20. The method of claim 16, additionally comprising a step of post-annealing the device structure.

21. The method of claim 16, in which the step of forming a device structure on the conductive layer additionally includes a step of annealing the substrate and the layer of the poly(arylamine) prior to the step of depositing the layer of the electron-transporting and light-emitting material.

22. The method of claim 16, in which, in the step of providing an electron-transporting and light-emitting material, a metal chelated oxinoid compound represented by the structural formula (0) is provided:

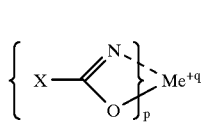

Formula (0)

in which Me represents a metal, q is an integer between 0 and 3 and X independently in each occurrence represents atoms completing a nucleus having at least two fused aromatic rings, at least one of which is an azole or azine ring.

23. The method of claim 22, in which the metal chelated oxinoid compound includes aluminum tris-8-hydroxyquinoline.

24. The method of claim 16, in which:

the method additionally comprises a step of providing a fluorescent dye; and the step of depositing the layer of the electron-transporting and light-emitting material includes a step of doping the electron-transporting and light-emitting material with the fluorescent dye.

* * * * *